United States Patent
Cheng et al.

(10) Patent No.: US 9,614,489 B2
(45) Date of Patent: Apr. 4, 2017

(54) SOUND PRODUCING SYSTEM AND AUDIO AMPLIFYING METHOD THEREOF

(71) Applicant: HTC Corporation, Taoyuan County (TW)

(72) Inventors: Chih-Chiang Cheng, Taoyuan County (TW); Chun-Min Lee, Taoyuan County (TW); Hann-Shi Tong, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 118 days.

(21) Appl. No.: 14/335,954

(22) Filed: Jul. 21, 2014

(65) Prior Publication Data
US 2015/0010168 A1 Jan. 8, 2015

Related U.S. Application Data

(63) Continuation-in-part of application No. 13/752,375, filed on Jan. 28, 2013, now Pat. No. 9,173,020.
(Continued)

(51) Int. Cl.
*H03G 9/02* (2006.01)
*H03G 7/00* (2006.01)
(Continued)

(52) U.S. Cl.
CPC .............. *H03G 9/025* (2013.01); *H03G 7/002* (2013.01); *H03G 7/007* (2013.01); *H03G 9/005* (2013.01);
(Continued)

(58) Field of Classification Search
CPC .... H04R 3/002; H04R 3/007; H04R 2499/11; H04R 29/001; H03G 7/002; H03G 9/025; H03G 9/005; H03G 7/007
(Continued)

(56) References Cited

U.S. PATENT DOCUMENTS

| 5,331,291 A | 7/1994 | D'Agostino et al. |
| 5,548,650 A | 8/1996 | Clark |

(Continued)

FOREIGN PATENT DOCUMENTS

| CN | 102812636 | 12/2012 |
| CN | 103369447 | 10/2013 |

(Continued)

OTHER PUBLICATIONS

"Search Report of Europe Counterpart Application", issued on Jun. 3, 2015, p. 1-p. 3.
(Continued)

*Primary Examiner* — David Ton
(74) *Attorney, Agent, or Firm* — Jianq Chyun IP Office

(57) ABSTRACT

The invention provides one sound producing system including a speaker, a driving circuit and an audio controller. The speaker is used for producing an audible sound. The driving circuit is connected to the speaker. The audio controller is configured to receive an input audio signal and pre-amplify the input audio signal with an amplify gain to obtain a pre-amplified audio signal; operate a multiband dynamic range control on the pre-amplified audio signal to obtain an output audio signal; convert the output audio signal to a driving voltage; provide the driving voltage to the speaker through the driving circuit; detect over the driving circuit to obtain at least one excursion parameter to determine an estimated excursion of the speaker in response to the driving voltage; and adjust the amplify gain according to the estimated excursion.

28 Claims, 8 Drawing Sheets

Related U.S. Application Data

(60) Provisional application No. 61/932,261, filed on Jan. 28, 2014, provisional application No. 61/615,904, filed on Mar. 27, 2012.

(51) Int. Cl.
*H04R 3/00* (2006.01)
*H03G 9/00* (2006.01)
*H04R 29/00* (2006.01)

(52) U.S. Cl.
CPC .............. *H04R 3/002* (2013.01); *H04R 3/007* (2013.01); *H04R 29/001* (2013.01); *H04R 2499/11* (2013.01)

(58) Field of Classification Search
USPC ............... 381/96, 102–104, 106–108, 58, 59
See application file for complete search history.

(56) References Cited

U.S. PATENT DOCUMENTS

| | | | |
|---|---|---|---|
| 6,931,135 B1 | 8/2005 | Kohut | |
| 7,039,206 B2 | 5/2006 | Mellow | |
| 7,274,793 B2 | 9/2007 | Combest et al. | |
| 7,783,062 B2* | 8/2010 | Xiao | H04B 1/20 330/2 |
| 8,019,088 B2 | 9/2011 | Holman | |
| 8,351,621 B2 | 1/2013 | Lehnert et al. | |
| 9,173,020 B2* | 10/2015 | Cheng | H04F 3/00 |
| 2003/0072462 A1 | 4/2003 | Hlibowicki | |
| 2008/0269926 A1* | 10/2008 | Xiang | H03G 3/32 700/94 |
| 2010/0204996 A1* | 8/2010 | Zeng | H03G 9/025 704/500 |
| 2011/0110533 A1* | 5/2011 | Choi | H03G 9/005 381/99 |
| 2011/0228945 A1* | 9/2011 | Mihelich | H04R 3/002 381/59 |
| 2012/0106750 A1* | 5/2012 | Thormundsson | H04R 3/007 381/71.12 |
| 2012/0179456 A1 | 7/2012 | Ryu et al. | |
| 2012/0281844 A1 | 11/2012 | Luo et al. | |
| 2012/0328117 A1* | 12/2012 | Gautama | H03F 1/52 381/59 |
| 2013/0013096 A1* | 1/2013 | Seefeldt | H03G 9/005 700/94 |
| 2013/0077795 A1 | 3/2013 | Risbo et al. | |
| 2013/0195277 A1 | 8/2013 | Kannan et al. | |
| 2013/0216049 A1* | 8/2013 | Wolf | H04R 1/00 381/55 |
| 2013/0259245 A1 | 10/2013 | Cheng et al. | |
| 2015/0124982 A1* | 5/2015 | Berthelsen | H04R 29/001 381/59 |
| 2015/0310874 A1* | 10/2015 | Fromel | G10L 21/0364 704/205 |

FOREIGN PATENT DOCUMENTS

| | | |
|---|---|---|
| EP | 2369852 | 9/2011 |
| EP | 2538699 | 12/2012 |
| WO | 0103466 | 1/2001 |
| WO | 2011115944 | 9/2011 |

OTHER PUBLICATIONS

"Office Action of Europe Counterpart Application", issued on Jun. 22, 2015, p. 1-p. 6.

"Office Action of European Counterpart Application", issued on Nov. 4, 2013, p. 1-p. 7.

"Office Action of European Counterpart Application", issued on Aug. 12, 2013, p. 1-p. 3.

"Office Action of U.S. Parent Application, U.S. Appl. No. 13/752,375" issued on Mar. 6, 2015, p.1-p. 17.

"Office Action of China Counterpart Application", issued on Dec. 28, 2016, p. 1-p. 13, in which the listed references were cited.

* cited by examiner

SOUND PRODUCING SYSTEM AND AUDIO AMPLIFYING METHOD THEREOF

CROSS-REFERENCE TO RELATED APPLICATION

This application is a continuation-in-part application of and claims the priority benefit of a prior application Ser. No. 13/752,375, filed on Jan. 28, 2013, now pending. The prior application Ser. No. 13/752,375 claims the priority benefit of U.S. Provisional application Ser. No. 61/615,904, filed on Mar. 27, 2012. This continuation-in-part application also claims the priority benefits of U.S. provisional application Ser. No. 61/932,261, filed on Jan. 28, 2014. The entirety of each of the above-mentioned patent applications is hereby incorporated by reference herein and made a part of this specification.

BACKGROUND

1. Field of the Invention

The invention relates to a sound producing system and a method thereof. Particularly, the invention relates to the sound producing system with multi-band dynamic range control operation.

2. Description of Related Art

In conventional sound producing system, a gain of the amplifying apparatus is automatic controlled according to the excursion of the speaker. In the opinion of the audio and the excursion, a content of the audio includes a first resonance frequency audio from the speaker. A loudness of the first resonance frequency audio is limited by an excursion of the diaphragm of the speaker and the sense of hearing of human. Such as that, in digital space, a range of the gain for amplifying the audio is limited, and the improvement space for low frequency band of the audio is limited, too.

SUMMARY OF THE INVENTION

The invention is directed to sound producing systems and method thereof, and the sound quality and loudness, especially in audible bass bands are optimized accordingly.

The invention provides one sound producing system including a speaker, a driving circuit and an audio controller. The speaker is used for producing an audible sound. The driving circuit is connected to the speaker. The audio controller is connected to the speaker through the driving circuit. The audio controller is configured to receive an input audio signal and pre-amplify the input audio signal with an amplify gain to obtain a pre-amplified audio signal; operate a multiband dynamic range control on the pre-amplified audio signal to obtain an output audio signal; convert the output audio signal to a driving voltage; provide the driving voltage to the speaker through the driving circuit; detect over the driving circuit to obtain at least one excursion parameter to determine an estimated excursion of the speaker in response to the driving voltage; and adjust the amplify gain according to the estimated excursion.

The invention provides another sound producing system including an automatic gain controller, a delay unit, a multi-band dynamic range controller (MBDRC), and an excursion controller. The automatic gain controller receives an input audio signal and an amplify gain and controls the amplify gain of the input audio signal to generate a pre-amplified audio signal according to the input audio signal and the amplify gain. The delay unit is coupled to the automatic gain controller and provides a delay time for transporting the pre-amplified audio signal. The MBDRC is coupled to the delay unit for receiving the pre-amplified audio signal and operates a multi-band dynamic range control operation on the pre-amplified audio signal to generate an output audio signal. The driving circuit is coupled between the multi-band dynamic range controller and the speaker, and the driving circuit receives and amplifies the output audio signal for driving the speaker. The excursion controller is coupled to the driving circuit for receiving a feedback voltage and a feedback current applied on the speaker, wherein the excursion controller determine the amplify gain according to the input audio signal, the feedback voltage and the feedback current.

The invention also provides a sound producing method including: receiving an input audio signal and pre-amplify the input audio signal with an amplify gain to obtain a pre-amplified audio signal; operating a multiband dynamic range control on the pre-amplified audio signal to obtain an output audio signal; converting the output audio signal to a driving voltage; providing the driving voltage to a speaker through the driving circuit; detecting over the driving circuit to obtain at least one excursion parameter to determine an estimated excursion of the speaker in response to the driving voltage; and adjusting the amplify gain according to the estimated excursion.

According to the above descriptions, in the invention, the estimated excursion of the speaker is obtained by the feedback current and the feedback voltage. The amplify gain is determined according to the estimated excursion of the speaker (as well as the signal controller). Furthermore, the MBDRAC operation is provided in the sound producing system and the sound producing system. That is, the input audio signal can be controlled by different frequency bands of the input audio, and the sound quality and loudness based on the speaker's (such as micro-speaker) ability can be improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
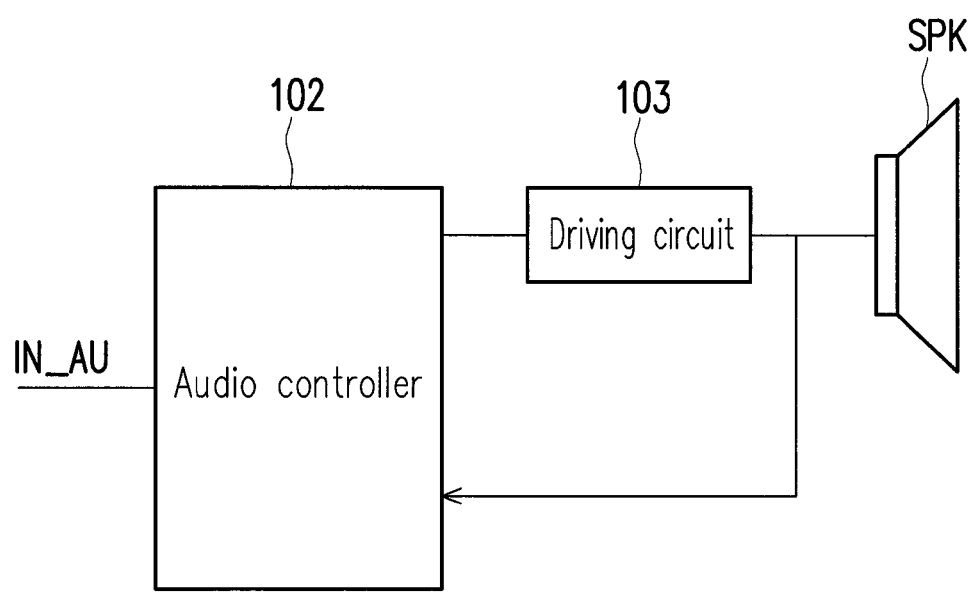
FIG. 1A illustrates a sound producing system according to an exemplary embodiment of the present application.

Referring to FIG. 1A, FIG. 1A illustrates a sound producing system according to an exemplary embodiment of the present application. The sound producing system 101 includes an audio controller 102, a driving circuit 103 and a speaker SPK. The speaker SPK is used for producing an audible sound. The driving circuit 103 is coupled to the speaker SPK and provides a signal for driving the speaker SPK. The audio controller 102 is coupled to the speaker SPK and the driving circuit 103. The audio controller 102 is configured to receive and process an input audio signal IN_AU, and generate and convert an output audio signal to a driving voltage. The driving circuit 103 provides the driving voltage to the speaker SPK for driving the speaker SPK.

In detail, the audio controller 102 receive an amplify gain and pre-amply the input audio signal IN_AU with the amplify gain to obtain a pre-amplified audio signal. Then, the audio controller 102 operates a multiband dynamic range control operation on the pre-amplified audio signal for generating the output audio signal. Furthermore, the audio controller 102 may convert the output audio signal to the driving voltage, and the driving voltage may be transported to the speaker SPK through the driving circuit 103 for driving the speaker SPK.

On the other hand, the audio controller 102 detects over the driving circuit 103 to obtain at least one excursion parameter of the speaker SPK. The audio controller 102 may determine an estimated excursion of the speaker SPK according to the at least one excursion parameter in response to the driving voltage. Also, the audio controller 102 adjusts the amplify gain according to the estimated excursion.

Please note here, the audio controller 102 may operate the multiband dynamic range control on the pre-amplified audio signal for generating a compressed audio signal. Then, the audio controller 102 may limit an overall level of the compressed audio signal to a threshold level by applying a limiting gain to the compressed audio signal for limiting the level of the output audio signal and obtaining a limited audio signal as the output audio signal. The limiting gain may also be adjusted according to the estimated excursion of the speaker SPK by the audio controller 102.

The speaker SPK has at least one diaphragm. The diaphragm has a highest response over a resonance frequency. In response thereto, the audio controller 102 is operative to operate a first dynamic range control operation over a first frequency band of the pre-amplified audio signal, and the first frequency band is below the resonant frequency. Moreover, the audio controller 102 is operative to operate a second dynamic range control operation over a second frequency band of the pre-amplified audio signal, and the second band is higher than the resonant frequency. Especially, the compression ratio of the first dynamic range control operation is higher than the compression ratio of the second dynamic range control operation.

The audio controller 102 is also operative to buffer the pre-amplified audio signal, and filter the buffered pre-amplified audio signal over at least two frequency bands to obtain at least two filtered audio signals each corresponding to one of the at least two frequency bands. The audio controller 102 operates at least two separated dynamic range controls over the at least two filtered audio signal respectively to obtain at least two compressed filtered audio signals. Additionally, the audio controller 102 obtains the compressed audio signals by summing the at least two compressed filtered audio signals.

About the estimated excursion, the audio controller 102 receives a driving current on the driving circuit 103, and generates a first excursion parameter accordingly. Wherein, the driving current is generated in response to the driving voltage applied on the speaker SPK, and the driving current is feedback to the audio controller 102 from the speaker SPK. On the other hand, the output audio signal generated by the audio controller 102 may be used to generate a second excursion parameter. That is, the audio controller 102 may determine the estimated excursion of the speaker SPK in response to the driving voltage based on the first excursion parameter and the second excursion parameter.

In the operation, the input audio signal IN_AU is transported to the audio controller 102 in continuity. The audio controller 102 may delay the input audio signal IN_AU to obtain a first input audio signal for looking ahead. Based on the first input audio signal, an estimated excursion of the speaker SPK in response to the first input audio signal can be determined by the audio controller 102, and whether the first estimated excursion enters a non-linear region of a force factor or stiffness for the speaker SPK can be determined accordingly. When the estimated excursion enters the non-linear region, the audio controller 102 may compensate the first input audio signal to generate a second input audio signal, and the audio controller 102 may pre-amplify the second input audio signal with the amplify gain to obtain the pre-amplified audio signal. Besides, based on the estimated excursion of the speaker SPK in response to the first input audio signal, whether the excursion of the speaker SPK exceeds a maximum allowable value can be determined accordingly. When the estimated excursion of the speaker SPK exceeds an excursion threshold, wherein the excursion threshold is corresponding to the value of the estimated excursion when the audio controller 102 may assume the excursion of the speaker SPK has exceeded the maximum allowable excursion, the audio controller 102 may reduce the amplify gain, and the excursion of the speaker SPK can be controlled to prevent from exceeding the maximum allowable value and to prevent the damage of the speaker SPK. The excursion threshold may be predetermined according to the physical characteristics of the speaker. The excursion threshold can also be a predetermined threshold which the audio controller 102 may hard clip or soft clip the output audio signal to prevent the speaker SPK from damage.

About the driving circuit 103, a digital to analog converter and an amplifier may be disposed in the driving circuit 103. The digital to analog converter is used to convert the output audio signal to an analog output signal, and the amplifier is used to amplify the analog output audio signal under a bias voltage to obtain the driving voltage. The bias voltage may be controlled from the audio controller 102, and the audio controller 102 may detect a signal level of the first input audio signal over a time span, and adjust a level of the bias voltage based on the signal level of the first input audio signal. That is, the signal level of the first input audio signal may be monitored, and when the first input audio signal with small volume is inputted to the audio controller 102, the voltage level of the bias voltage for the amplifier can be reduced, and power consumption can be saved.

Figure 1B:
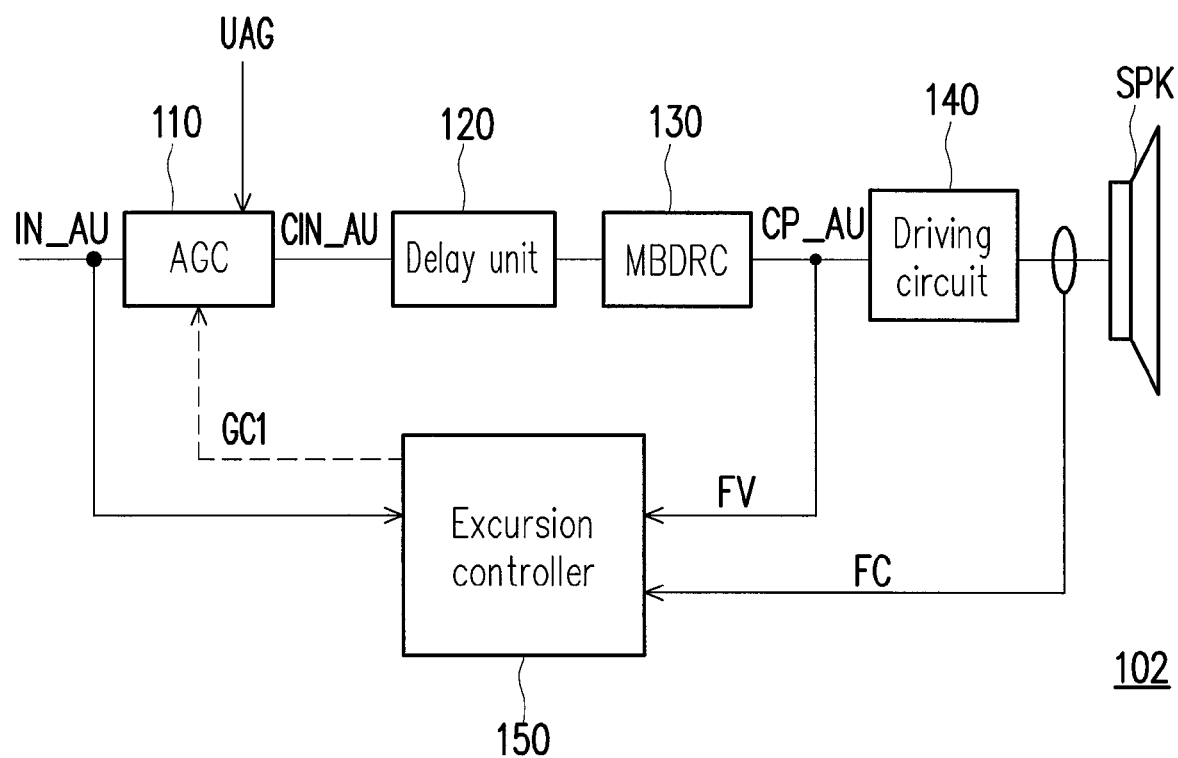
FIG. 1B illustrates a block diagram of another sound producing system 102 according to an exemplary embodiment of the present invention.

Referring to FIG. 1B, FIG. 1B illustrates a block diagram of another sound producing system 102 according to an exemplary embodiment of the present invention. The sound producing system 102 includes an automatic gain controller (AGC) 110, a delay unit 120, a multi-band dynamic range controller (MBDRC) 130, a limiter (not shown), a driving circuit 140 and an excursion controller 150. The sound producing system 100 is used to drive a speaker SPK.

The AGC 110 receives an input audio signal IN_AU and an amplify gain UAG, wherein the amplify gain UAG is provided by an application processor according to the setting of a playback application or instruction from an user, and the AGC 110 controls a gain of the input audio signal IN_AU to generate a pre-amplified audio signal CIN_AU according to the amplify gain UAG. The delay unit 120 is coupled between an output of the AGC 110 and an input of the MBDRC 130. The delay unit 120 provides a delay time for transporting the pre-amplified audio signal CIN_AU to the input of the MBDRC 130. The MBDRC 130 is coupled to the delay unit 120 for receiving the pre-amplified audio signal CIN_AU from the delay unit 120, and the MBDRC 130 operates a multi-band dynamic range control operation on the pre-amplified audio signal CIN_AU to generate an output audio CP_AU. A gain limiter may be used to limit the level of the output audio CP_AU. In FIG. 1B, the output audio CP_AU is transported to the amplifier 140, and the amplifier 140 amplifying the output audio CP_AU to drive the speaker SPK.

On the other hand, the excursion controller 150 is coupled between the driving circuit 140 and the AGC 110 to form a feedback circuit. The excursion controller 150 receives a voltage signal received by the amplifier 140 to formed a feedback voltage FV, and the excursion controller 150 also receives a current flowing through the speaker SPK to form a feedback current FC. The excursion controller 150 generates a first gain control signal GC1 according to the input audio signal IN_AU, the feedback voltage FV and the feedback current FC, and provided the first gain control signal GC1 to the AGC 110 to notify the ACG 110 whether an estimated excursion of the speaker SPK enters a non-linear region of a force factor or stiffness for the speaker. Accordingly, the audio controller 102 may compensate the first input audio signal to generate a second input audio signal when the ACG 110 receives the first gain control signal GC1 notifying that the estimated excursion of the speaker SPK enters the non-linear region.

In detail, the MBDRC 130 divides the pre-amplified audio signal CIN_AU into a plurality of parts according to a plurality of different frequency bands. The MBDRC 130 respectively operates a plurality of controlling (compressing or expanding) operations on the plurality of parts of the pre-amplified audio signal CIN_AU. The controlling operations respectively corresponding to the frequency bands may be different. That is, the different frequency bands of the pre-amplified audio signal CIN_AU can be respectively compressed or expanded by different methods, an optimized audio signal can be obtained.

It should be noted here, the estimated excursion of the speaker SPK is important in the embodiment. The excursion controller 150 calculates the estimated excursion of the speaker SPK according to the feedback voltage FV and the feedback current FC, and the excursion controller 150 generate the first gain control signal GC1 to notify the AGC 110 according to the estimated excursion and the input audio signal. For example, the excursion controller 150 calculates the estimated excursion of the speaker SPK according to the feedback voltage FV and the feedback current FC. For example, the excursion controller 150 calculates the estimated excursion of the speaker SPK by the impedance which is calculated by the feedback voltage FV and the feedback current FC, and obtains the first gain control signal GC1 according to the estimated excursion.

Figure 2:
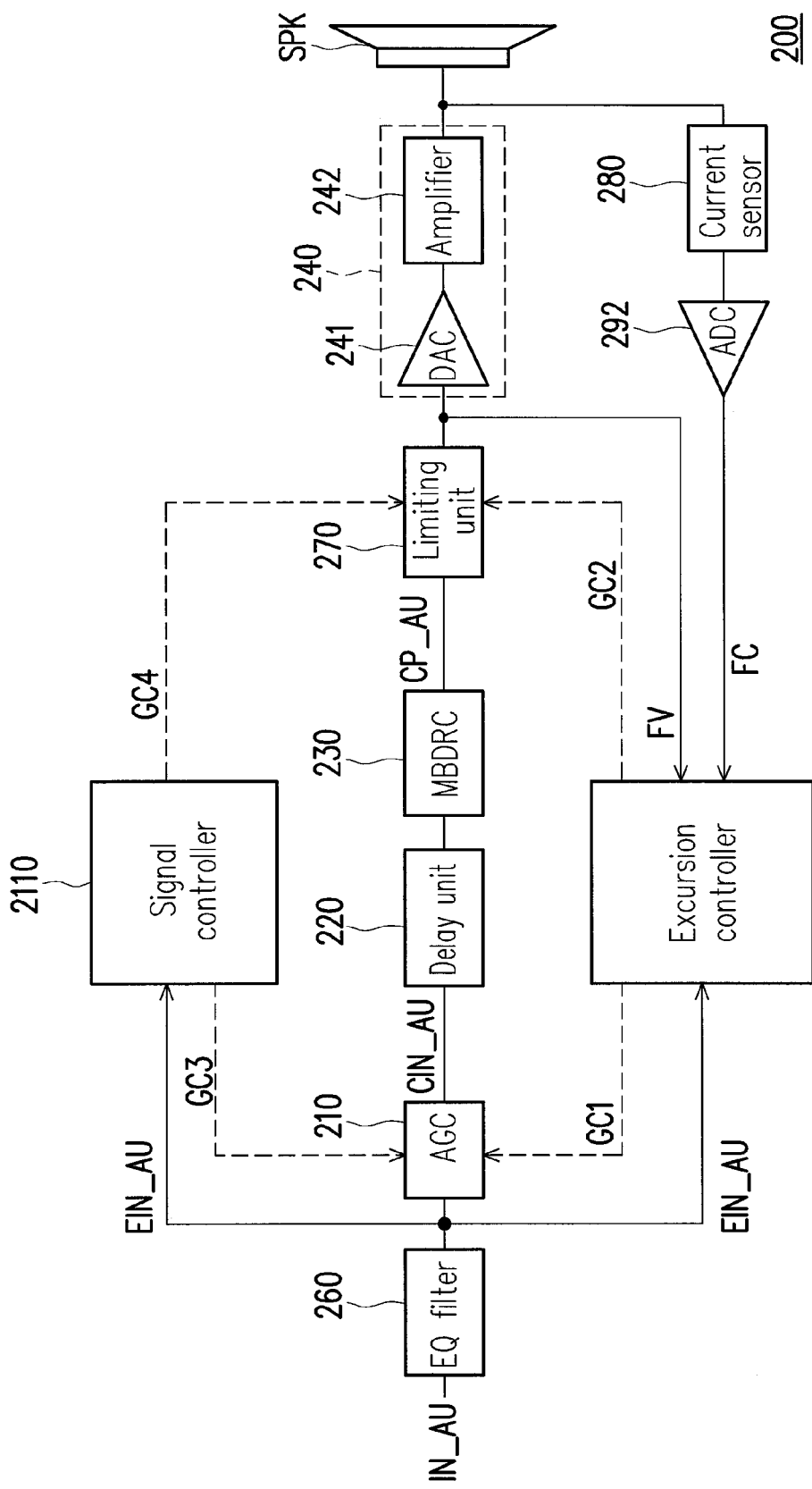
FIG. 2 illustrates a block diagram of another sound producing system 200 according to another exemplary embodiment of the present invention.

Referring to FIG. 2, FIG. 2 illustrates a block diagram of a sound producing system 200 according to another exemplary embodiment of the present invention. The sound producing system 200 includes an automatic gain controller (AGC) 210, a delay unit 220, a multi-band dynamic range controller (MBDRC) 230, an amplifier 242, an excursion controller 250, an equalization (EQ) filter 260, a limiting unit 270, a current sensor 280, a digital to analog converter (DAC) 241, an analog to digital converter (ADC) 292, and a signal controller 2110, wherein, the DAC 241 and the amplifier 242 form a driving circuit 240.

In FIG. 2, an input audio signal of music content may be preliminarily processed by the EQ filter 260, and the equalized input audio signal EIN_AU is sent to the AGC 210 for pre-amplifying by the AGC 210 according to an amplify gain. The AGC 210 generates the pre-amplified audio signal CIN_AU by amplifying the equalized input audio signal EIN_AU. Moreover, the pre-amplified audio signal CIN_AU is transported to the delay unit 220 and the delay unit 220 provides a delay time for transporting the pre-amplified audio signal CIN_AU to the MBDRC 230. During a period of the delay time, the excursion controller 250 is used to calculate the estimated excursion of the diaphragm of the speaker SPK, and the first gain control signal GC1 is generated by the excursion controller 250 according to the estimated excursion.

Figure 3:
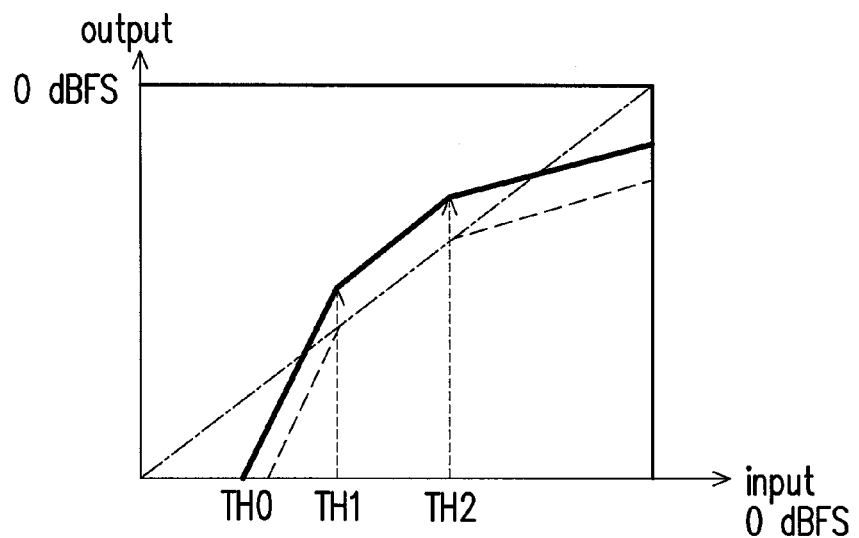
FIG. 3 illustrates a diagram of input and output of the MBDRC 230 in FIG. 2.

The pre-amplified audio signal CIN_AU is transported to the MBDRC 230 through the delay unit 220. Referring to FIG. 3, FIG. 3 illustrates a diagram of input and output of the MBDRC 230 in FIG. 2. In FIG. 3, the pre-amplified audio signal CIN_AU may be divided into three parts with different volumes. The MBDRC 230 may be an expander to process the input audio which volume is lower than TH1. In a middle volume region, the volume of the output audio may be matched up with the input audio when the volume of the input audio is between TH1 and TH2. In an upper volume region, the volume of the output audio is generated by reducing the volume of the input audio which is larger than TH2.

Figure 4:
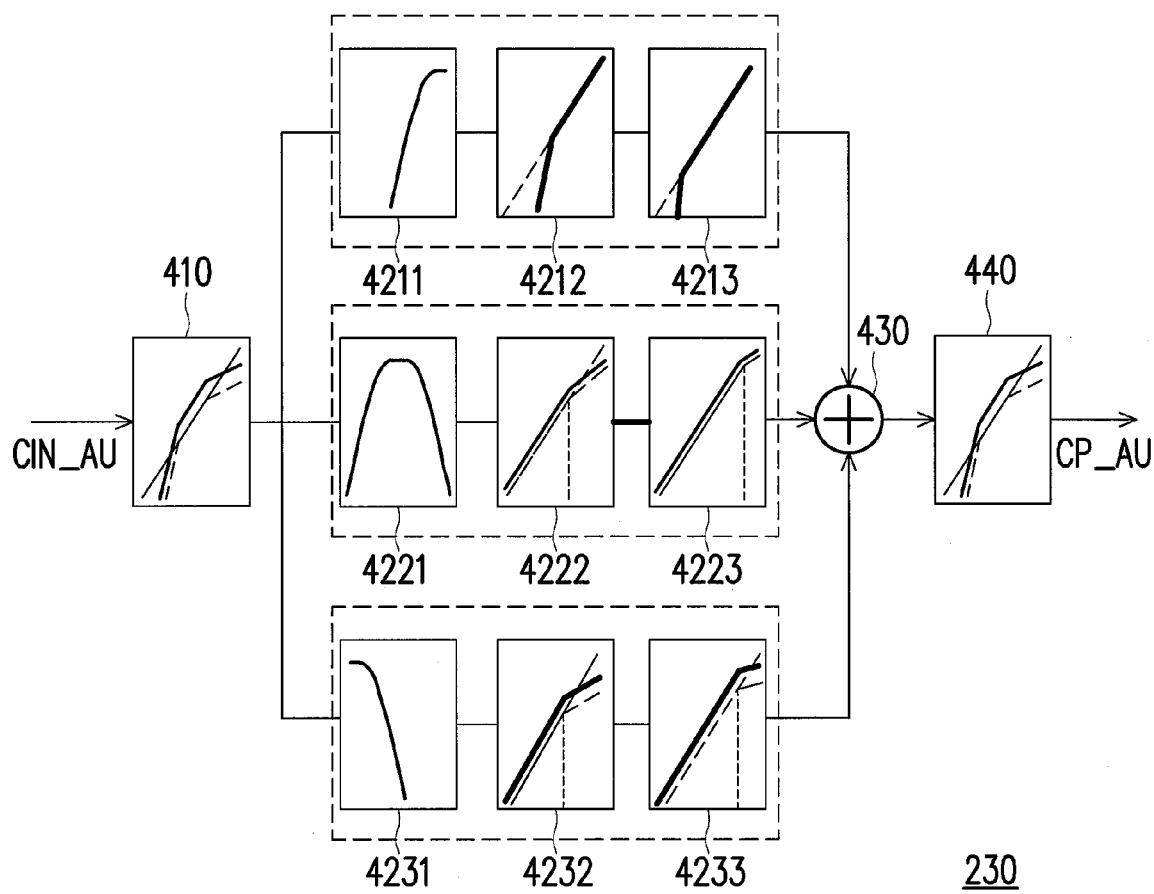
FIG. 4 illustrates a block diagram of MBDRC 230 according to the exemplary embodiment of FIG. 2.

In detail, referring to FIG. 4, FIG. 4 illustrates a block diagram of MBDRC 230 according to the exemplary embodiment of FIG. 2. The MBDRC 230 includes a pre-dynamic range controller 410, band divided filters 4211, 4221 and 4231, dynamic range controllers 4212, 4213, 4222, 4223, 4232 and 4233, a summation unit 430, and a post-dynamic range controller 440. In FIG. 4, the pre-amplified audio signal CIN_AU is processed by the pre-dynamic range controller 410 in first stage, and then the output of the pre-dynamic range controller 410 is transported to the filters 4211, 4221 and 4231 for processing in parallel. The filters 4211, 4221 and 4231 are respectively a low pass filter, a band pass filter and a high pass filter. That is, the passing bands of the filters 4211, 4221 and 4231 respectively are different.

The filter 4231 filtered out the low frequency part of the pre-amplified audio signal CIN_AU, and the low frequency part of the pre-amplified audio signal CIN_AU is transported to the dynamic range controllers 4232 and 4233 in sequence for controlling. The filter 4221 filtered out the middle frequency part of the pre-amplified audio signal CIN_AU, and the middle frequency part of the pre-amplified audio signal CIN_AU is transported to the dynamic range controllers 4222 and 4223 in sequence for controlling. Further, the filter 4211 filtered out the high frequency part of the pre-amplified audio signal CIN_AU, and the high frequency part of the pre-amplified audio signal CIN_AU is transported to the dynamic range controllers 4212 and 4213 in sequence for controlling.

All of the outputs of the dynamic range controllers 4213, 4223 and 4233 are transported to the summation unit 430 for a summing operation. A result of the summing operation is transported to the post-dynamic range controllers 440 for controlling to generate the output audio CP_AU.

In this control process, it dynamically alters the compression or expansion ratio and corresponding make-up gain based on the characteristic of each band. By using this apparatus, it enhances and emphasizes the detail of the music content. In addition, the sound quality can be further improved by using expanders to depress the small hiss noise in high band, which is perceptually awful.

Figure 5:
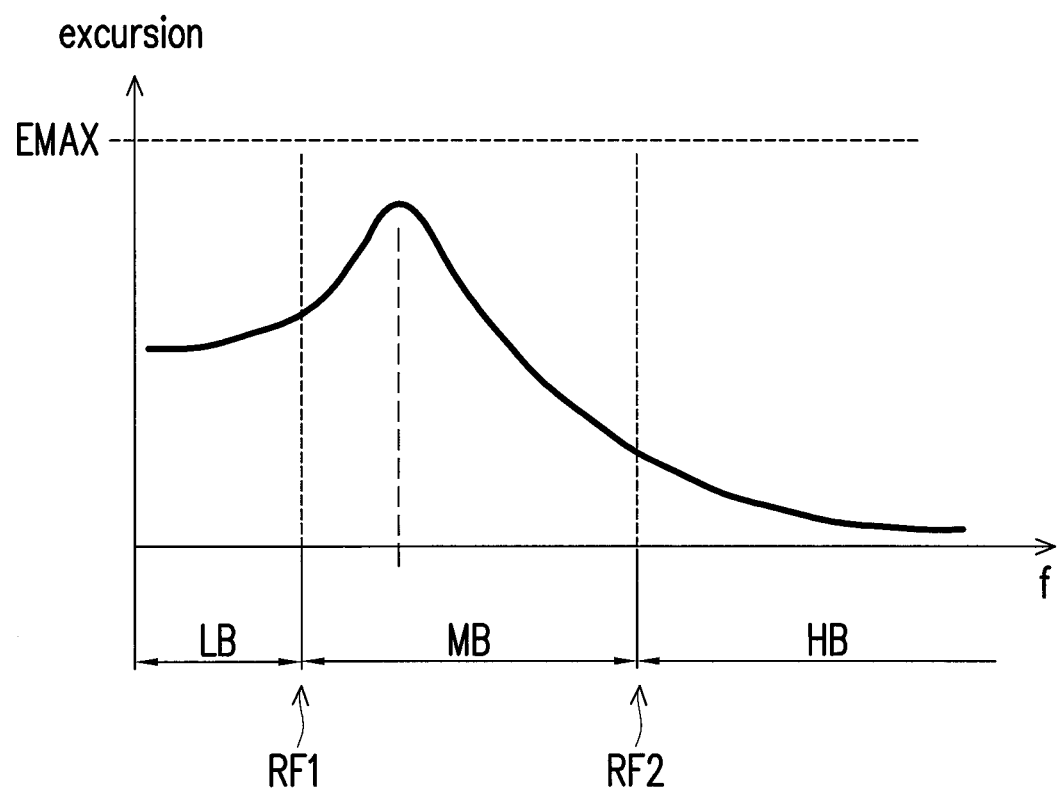
FIG. 5 illustrates a vibrating characteristic of the speaker according to an exemplary embodiment of the present invention.

Referring to FIG. 5, FIG. 5 illustrates a vibrating characteristic of the speaker according to an exemplary embodiment of the present invention. The vibrating characteristic of a speaker may be divided according to the frequency bands of the input audio. In FIG. 5, the low band LB whose frequency is lower than the 1st resonant frequency RF1 of the speaker SPK; a mid-band MB whose frequency is above the 1st resonant frequency RF1 but below a second frequency RF2 (7 kHz for example); and high band HB whose frequency is above the second frequency RF2. In low band LB, the excursion of the speaker SPK is inherently high so that an aggressive compression ratio is applied. Such as that, the excursion of the speaker SPK is limited to be lower than a maximum possible excursion EMAX of the speaker SPK. As for the mid-band MB, a low compression ratio is applied because the excursion of the speaker SPK has large headroom. For the high band HB, an expander is used to depress the small signal. The quality perceptually of the audio form the speaker SPK can be optimized.

Furthermore, in this apparatus, MDRC 230 is designed for each one of a plurality of bands. For middle volume, it is processed by applying a related slow attack time and release time to avoid pumping effect. As for the large volume, it is processed by applying a fast attack time and release time to depress an instant peak of a signal.

Referring to FIG. 2, the current sensor 280 is coupled between the speaker SPK and the excursion controller 250. The current sensor 280 senses a current flowing through the speaker SPK to generate the feedback current FC and transports the feedback current FC to the excursion controller 250. The ADC 292 is coupled to the current sensor 280, and the ADC 292 transport the feedback current FC from analog format to digital format. The excursion controller 250 receives the feedback current FC in digital format.

The limiting unit 270 is coupled to output of the MBDRC 230, and used for limiting a gain of the output audio CP_AU according to a second gain control signal GC2. Wherein, the second gain control signal GC2 is generated by the excursion controller 250. When the estimated excursion of the speaker SPK exceeds the excursion threshold, the excursion controller 250 can generate and transmit the second gain control signal GC2 to the limiting unit 270, so that the audio controller 200 can reduce the amplify gain once the limiting unit 270 receive the second gain control signal GC2.

The DAC 291 is coupled between the limiting unit 270 and the amplifier 240. The DAC 291 is used to convert the output of the limiting unit 270 from digital format to analog format.

The signal controller 2110 is coupled to the AGC 210, EQ filter 260 and the limiting unit 270. The signal controller 2110 receives the equalized input audio EIN_AU and provides a third gain control signal GC3 to the AGC 210 and a fourth gain control signal GC4 to the limiting unit 270. When the signal controller 2110 decides the estimated excursion to enter the non-linear region by analyzing the equalized input audio EIN_AU through a look ahead analyzing scheme, the signal controller 2110 transports the third gain control signal GC3 to the AGC 210. The AGC 210 may compensate the equalized input audio EIN_AU according to the third gain control signal GC3. On the other hand, when the signal controller 2110 decides the estimated excursion to enter an excursion threshold region by analyzing the equalized input audio EIN_AU through the look ahead analyzing scheme, the signal controller 2110 transports the fourth gain control signal GC4 to the limiting unit 270. The limiting unit 270 may limit a gain of the output audio CP_AU according to the fourth gain control signal GC4. In FIG. 2, the AGC 210 may receive the first and third gain control signals GC1 and GC3 for the gain controlling operation simultaneously, and the limiting unit 270 may receive the second and fourth gain control signals GC2 and GC4 for the gain limiting operation simultaneously.

Figure 6A:
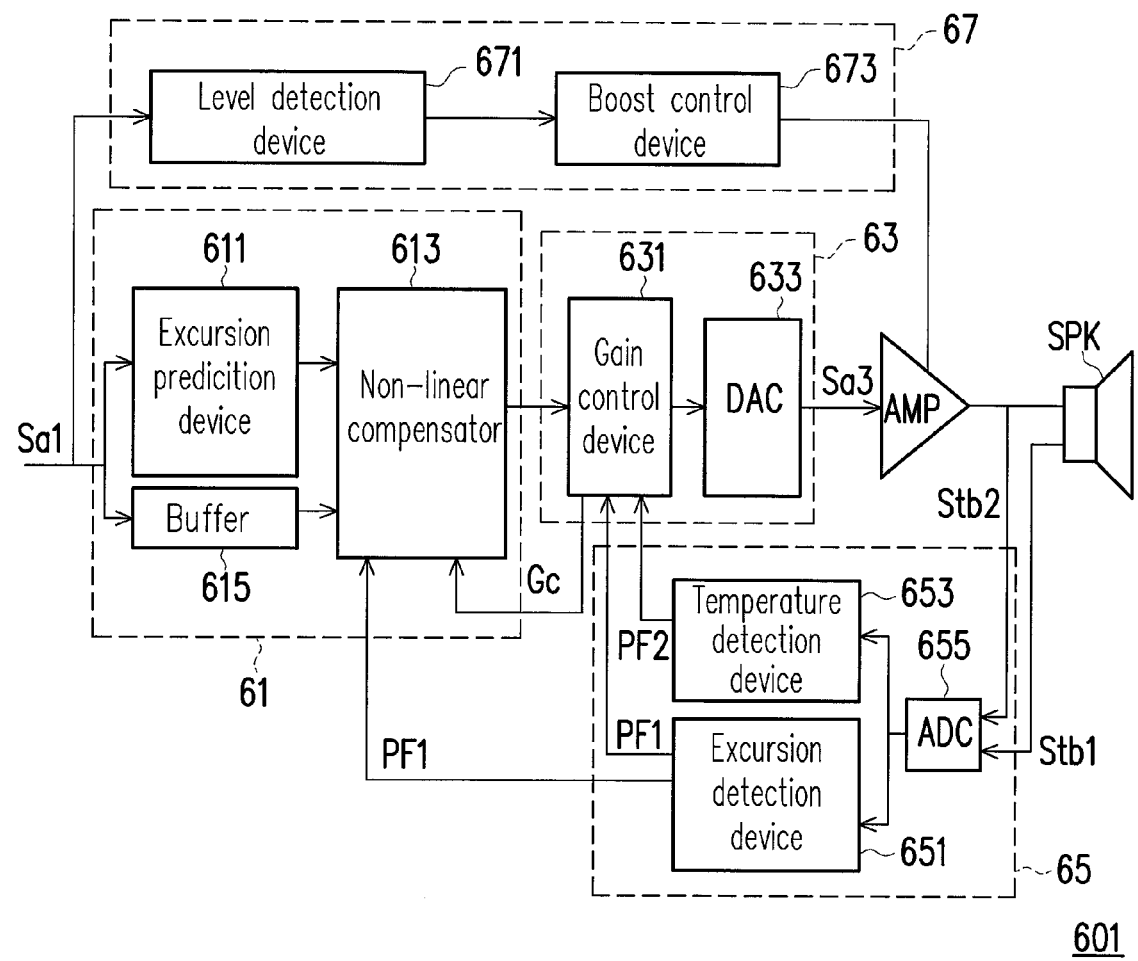
FIG. 6A illustrates a control apparatus for a speaker system.

Referring to FIG. 6A, FIG. 6A illustrates a control apparatus for a speaker system. The structure for a control apparatus 601 as shown in FIG. 6A includes a compensation unit 61, a gain unit 63, and a feedback unit 65. In FIG. 6A, an input audio signal (or called a first audio signal) Sa1 is to be amplified by an amplifier AMP and then to be reproduced by the speaker SPK.

In FIG. 6A, the compensation unit 61 includes an excursion prediction device 611 for excursion calculation, a non-linear compensator 613, and a buffer 615. In an example, the compensation unit 61 performs look-ahead based compensation. The first audio signal Sa1, e.g., in the form of a digital signal, is looked ahead, for example, by using the buffer 615. In practical application, the first audio signal Sa1 may need to be conditioned or can be default as a conditioned signal, or a signal conditioning circuit stage can be optionally included in the control apparatus 601 for generating the conditioned signal for processing of the following stages. For the sake of explanation, the first audio signal Sa1 can be regarded as a conditioned signal in the embodiment. The excursion prediction device 611 predicts or evaluates the corresponding excursion of the first audio signal Sa1 through a first model for the speaker SPK to generate a predicted excursion of the first audio signal. The non-linear compensator 613 determines whether compensation is needed according to the delayed first audio signal from the buffer 615 and the predicted excursion outputted from the excursion prediction device 611. In addition, the non-linear compensator 613 generates a second audio signal Sa2 by compensation according to the first model and the first detected parameter (denoted by PF1), the value Gc from the gain control unit 63, and the delayed first audio signal Sa1. If compensation for the first audio signal Sa1 is not needed, the non-linear compensator 613 outputs the first audio signal as the second audio signal Sa2 (or may be outputted through a scaling).

In determination as to whether compensation is needed, the non-linear compensator 613 may adopt one or more physical parameters of the speaker SPK so as to determine whether the predicted first parameter (such as excursion) enters a non-linear region of the physical parameter.

The gain unit 63 includes a gain control device 631 and a digital-to-analog converter (DAC) 633. In response to the second audio signal Sa2 and at least one detected parameter (such as the first detected parameter PF1 and/or second detected parameter PF2 and so on), the gain control device 631 outputs an output audio signal. In one example, the output audio signal may be converted by the DAC 633 so as to output a third audio signal Sa3 for the amplifier AMP. In addition, the gain control device 631 outputs a parameter, such as a value Gc indicating the gain value currently used in the gain unit 63, to the non-linear compensator 613 in order for the non-linear compensator 613 to adjust the non-linear compensation according to the current gain value.

The feedback unit 65 is employed to generate at least one detected parameter according to a feedback signal Sfb indicating such as a feedback current signal Sfb1 and a feedback voltage signal Sfb2 from the speaker. SPK. The feedback unit 65 includes an excursion control device (or called an excursion detection device) 651, a temperature detection device (or called a temperature detection device) 653, and an analog-to-digital converter (ADC) 655. The feedback current Sfb1 and the feedback voltage Sfb2 are evaluated through the temperature detection device 651 and the excursion detection device 651, respectively, so as to generate a first detected parameter PF1 (e.g., the detected excursion of the speaker) and a second detected parameter PF2 (e.g., the temperature of the speaker). According to one or more detected parameters such as PF1 and PF2 and the second audio signal Sa2, the gain control device 631 adjusts its gain value. The first detected parameter PF1 (i.e., the detected excursion) generated by the excursion detection device 651 is adaptively fed back to the non-linear compensator 613.

Figure 6B:
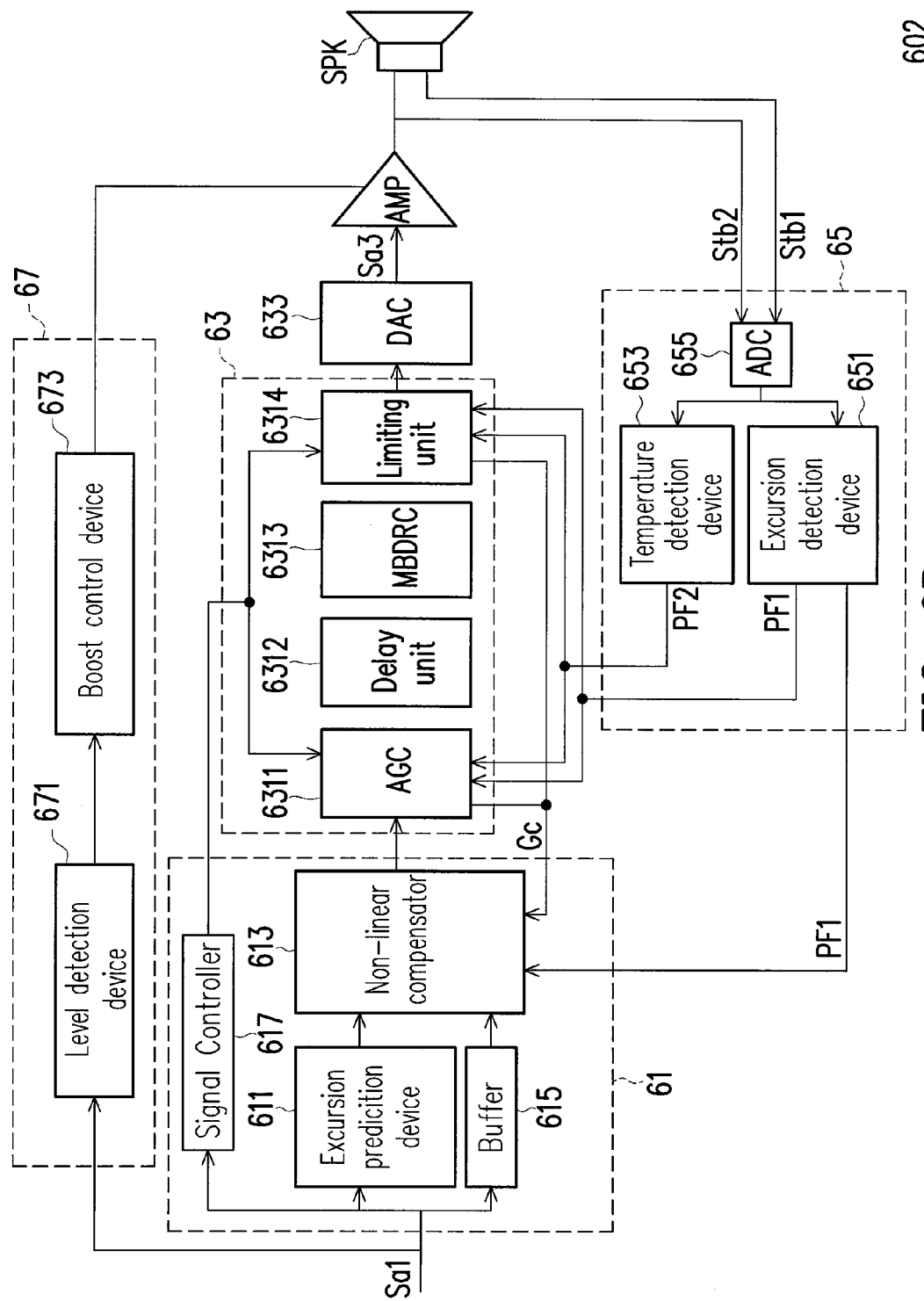
FIG. 6B illustrates a sound producing system 602 according to another embodiment of present application.

Referring to FIG. 6A and FIG. 6B, wherein, FIG. 6B illustrates a sound producing system 602 according to another embodiment of present application. The sound producing system 602 is obtained by verifying the control apparatus 601 in FIG. 6A. Difference from FIG. 6A, in FIG. 6B, a signal controller 617 is disposed in the compensation unit 61, and an AGC 6311, a delay unit 6312, a MBDRC 6313 and a limiting unit 6314 are disposed in the gain control unit 631.

The operation about the signal controller 617, AGC 6311, a delay unit 6312, a MBDRC 6313 and a limiting unit 6314 can be referred to the embodiment in FIG. 2. It can be realized that, a MBDRC operation may be used in the gain controller device 631, and the quality of the sound broadcasted by the speaker SPK can be promoted.

Figure 7:
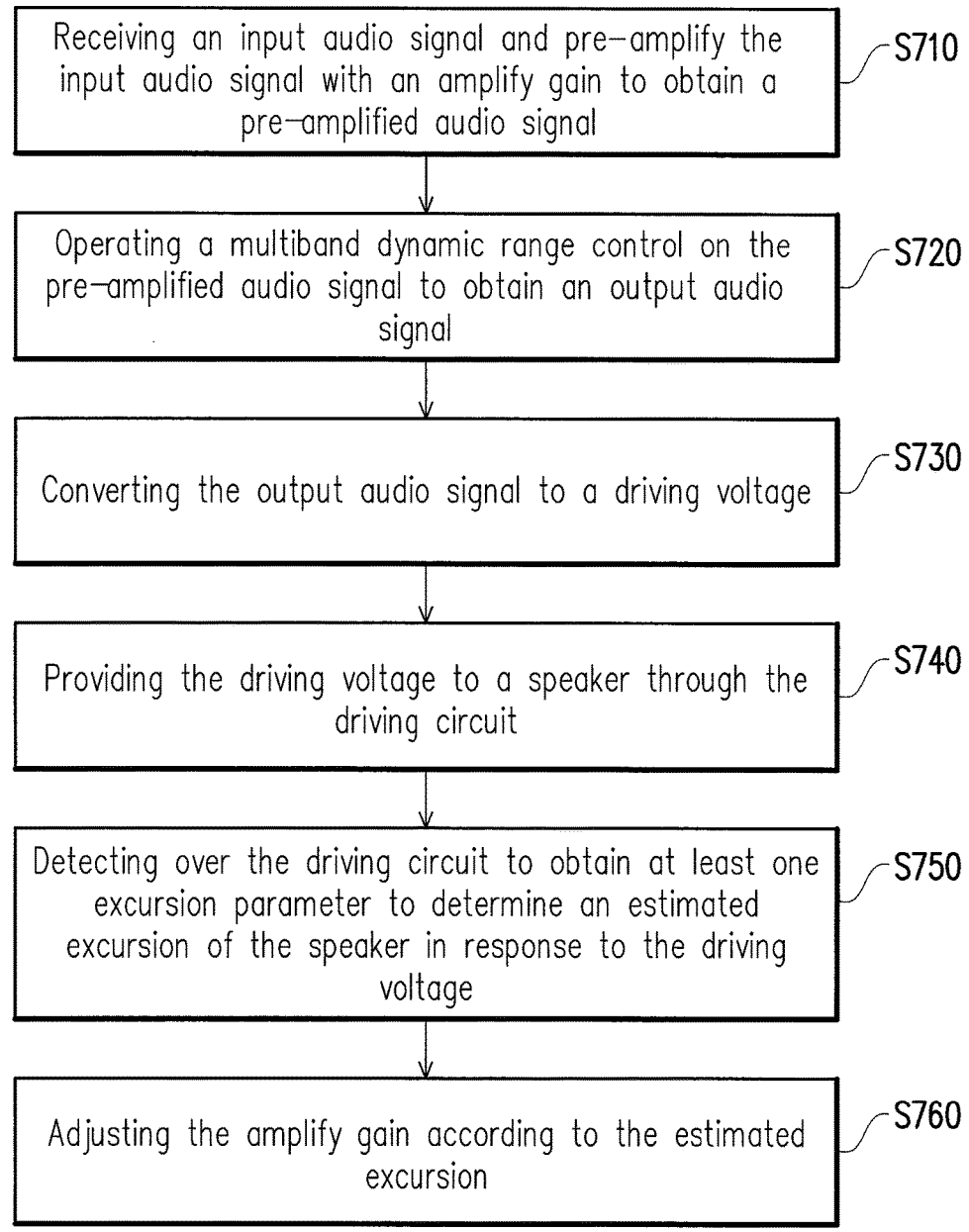
FIG. 7 illustrates a flow chart for a sound producing method according to an exemplary embodiment of the present invention.

Referring to FIG. 7, FIG. 7 illustrates a flow chart for a sound producing method according to an exemplary embodiment of the present invention. In the step S710, an input audio signal is received and pre-amplified with an amplify gain to obtain a pre-amplified audio signal. In step S720, a multiband dynamic range control is operated on the pre-amplified audio signal to obtain an output audio signal. Moreover, in step S730, the output audio signal is converted to a driving voltage, and the driving voltage is provided to a speaker through the driving circuit in step S740.

In step S750, at least one excursion parameter is detected over the driving circuit to obtain to determine an estimated excursion of the speaker in response to the driving voltage, and the amplify gain may be adjusted according to the estimated excursion in step S760.

Operation details of the audio amplifying method of the present embodiment have been described in detail in the aforementioned embodiment with reference of the sound producing system, so that detailed descriptions thereof are not repeated.

In summary, embodiments of a MDRC integrated current and voltage sensing control method and the corresponding control apparatus are provided. The input audio can be processed according to different frequency bands, and a performance of the output audio form the speaker can be optimized.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A sound producing system for a portable device, comprising:
   a speaker, for producing an audible sound;
   a driving circuit, connecting to the speaker;
   an audio controller, connecting to the speaker through the driving circuit, wherein the audio controller comprises:
      an automatic gain controller, receives an input audio signal and pre-amplifies the input audio signal with an amplify gain to obtain a pre-amplified audio signal;
      a delay unit, coupled to the automatic gain controller, provides a delay time for transporting the pre-amplified audio signal;
      a multi-band dynamic range controller (MBDRC), coupled to the delay unit for receiving the pre-amplified audio signal, operating a multi-band dynamic range control operation on the pre-amplified audio signal to generate a compressed audio signal and limiting an overall level of the compressed audio signal to generate an output audio signal according to estimated excursion of the speaker; and
      an excursion controller, comprising an excursion detection device and a temperature detection device being coupled to the driving circuit for receiving a feedback voltage and a feedback current applied on the speaker, wherein the excursion controller adjusts the amplify gain according to the input audio signal, the feedback voltage and the feedback current.

2. The sound producing system as claimed in claim 1, wherein the audio controller further configured to:
   limit the overall level of the compressed audio signal to a threshold level by adding a limiting gain to the compressed audio signal to obtain a limited audio signal as the output audio signal; and
   adjust the limiting gain according to the estimated excursion of the speaker.

3. The sound producing system as claimed in claim 2, wherein the speaker comprises at least one diaphragm, which has a highest impulse response over a resonance frequency, and the audio controller is operative to:
   operate a first dynamic range control operation over a first frequency band of the pre-amplified audio signal, wherein the first frequency band is below the resonant frequency;
   operate a second dynamic range control operation over a second frequency band of the pre-amplified audio signal, wherein the second band is higher than the resonant frequency;
   wherein the compression ratio of the first dynamic range control operation is higher than the compression ratio of the second dynamic range control operation.

4. The sound producing system as claimed in claim 2, wherein the audio controller is operative to:
buffer the pre-amplified audio signal;
filter the buffered pre-amplified audio signal over at least two frequency bands to obtain at least two filtered audio signals each corresponding to one of the at least two frequency bands;
operate separate dynamic range control over the at least two filtered audio signal to obtain at least two compressed filtered audio signals;
sum the at least two compressed filtered audio signals to obtain the compressed audio signals.

5. The sound producing system as claimed in claim 1, wherein the audio controller is operative to:
feedback a driving current on the driving circuit in response to the driving voltage applied on the speaker to generate a first excursion parameter;
feedback the output audio signal to generate a second excursion parameter; and
determine the estimated excursion of the speaker in response to the driving voltage based on the first excursion parameter and the second excursion parameter.

6. The sound producing system as claimed in claim 5, wherein the audio controller calculates an impedance of the speaker according to the first and second excursion parameters, and determined the estimated excursion of the speaker according to the impedance.

7. The sound producing system as claimed in claim 1, wherein the audio controller is operative to:
delay the input audio signal to obtain a first input audio signal for looking ahead;
determine, based on the first input audio signal, an estimated excursion of the speaker in response to the first input audio signal; and
determine whether the first estimated excursion enters a non-linear region of a force factor or stiffness for the speaker;
compensate the first input audio signal to generate a second input audio signal when the estimated excursion enters the non-linear region; and
pre-amplify the second input audio signal with the amplify gain to obtain the pre-amplified audio signal.

8. The sound producing system as claimed in claim 7, wherein the audio controller is operative to:
reduce the amplify gain when the estimated excursion of the speaker exceeds an excursion threshold.

9. The sound producing system as claimed in claim 7, wherein the input audio signal, the pre-amplified audio signal, and the output audio signal are digital signals, and the driving circuit comprises:
a digital to analog converter to convert the output audio signal to an analog output signal; and
an amplifier for amplify the analog output audio signal under a bias voltage to obtain the driving voltage;
wherein the audio controller is operative to:
provide the bias voltage to the amplifier;
detect a signal level of the first input audio signal over a time span; and
adjust a level of the bias voltage based on the signal level of the first input audio signal.

10. A sound producing system, coupled to a speaker, comprising:
an automatic gain controller, receiving an input audio signal and a first amplify gain, wherein the automatic gain controller generates a pre-amplified audio signal according to the input audio signal and the first amplify gain;
a delay unit, coupled to the automatic gain controller and providing a delay time for transporting the pre-amplified audio signal;
a multi-band dynamic range controller (MBDRC), coupled to the delay unit for receiving the pre-amplified audio signal, operating a multi-band dynamic range control operation on the pre-amplified audio signal to generate a compressed audio signal and limiting an overall level of the compressed audio signal to generate an output audio signal according to estimated excursion of the speaker;
a driving circuit, coupled between the multi-band dynamic range controllers and the speaker, wherein the driving circuit receives and amplifies the output audio signal for driving the speaker; and
an excursion controller, comprising an excursion detection device and a temperature detection device being, coupled to the driving circuit for receiving a feedback voltage and a feedback current applied on the speaker, wherein the excursion controller adjusts the first amplify gain according to the input audio signal, the feedback voltage and the feedback current.

11. The sound producing system as claimed in claim 10, wherein the excursion controller calculates an estimated excursion of the speaker according to the feedback voltage and the feedback current, and the excursion controller adjusts the first amplify gain according to the estimated excursion and the input audio signal.

12. The sound producing system as claimed in claim 11, wherein the excursion controller calculates an impedance by the feedback voltage and the feedback current, and generates the estimated excursion of the speaker according to the impedance.

13. The sound producing system as claimed in claim 10, wherein the MBDRC comprises:
a pre-dynamic range controller receiving the input audio signal and performing a pre-compressing operation on the input audio signal;
a plurality of filters being coupled to the pre-dynamic range controller for receiving an output of the pre-dynamic range controller, wherein pass bands of the filters respectively are different;
a plurality of dynamic range controller being respectively coupled to the filters and performing compressing or expanding operations on a plurality of output signals of the filters, respectively;
a summation unit being coupled to the dynamic range controllers for summing a plurality of output signals of the dynamic range controllers; and
a post-dynamic range controller receiving an output signal of the summation unit for compressing and generating the output audio signal.

14. The sound producing system as claimed in claim 11, wherein each of the dynamic range controllers comprise:
a first sub-dynamic range controller being coupled to the corresponding filter for compressing the output signal of the corresponding filter; and
a second sub-dynamic range controller being coupled to the first sub-dynamic range controller for receiving an output signal of the first sub-dynamic range controller.

15. The sound producing system as claimed in claim 10, further comprises:

a current sensor being coupled between the speaker and the driving circuit, wherein the current sensor sensing a current flowing through the speaker to generate the feedback current.

16. The sound producing system as claimed in claim 15, further comprises:
an analog to digital converter being coupled between the current sensor and the excursion controller, wherein the analog to digital converter converts the feedback current from analog format to digital format.

17. The sound producing system as claimed in claim 10, further comprises:
an analog to digital converter being coupled between the MBDRC and the amplifier, and converting the compressed audio from digital format to analog format.

18. The sound producing system as claimed in claim 10, further comprises:
a limiting unit being coupled between the MBDRC and the amplifier, wherein the limiting unit limits a gain of the output audio signal according to a second amplify gain.

19. The sound producing system as claimed in claim 10, wherein the excursion controller adjusts the first amplify gain during a period of the delay time.

20. The sound producing system as claimed in claim 10, further comprising:
an equalization filter receiving the input audio for equalizing the input audio signal.

21. A sound producing method, comprising:
receiving an input audio signal and pre-amplify the input audio signal with an amplify gain to obtain a pre-amplified audio signal;
operating a multiband dynamic range control on the pre-amplified audio signal to obtain a compressed audio signal and limiting an overall level of the compressed audio signal to generate an output audio signal according to estimated excursion of the speaker;
converting the output audio signal to a driving voltage;
providing the driving voltage to a speaker through the driving circuit;
detecting over the driving circuit to obtain at least one excursion parameter to determine an estimated excursion of the speaker in response to the driving voltage; and
adjusting the amplify gain according to the estimated excursion.

22. The audio amplifying method as claimed in claim 21, wherein the step of operate the multiband dynamic range control on the pre-amplified audio signal further comprises:
limiting the overall level of the compressed audio signal to a threshold level by adding a limiting gain to the compressed audio signal to obtain a limited audio signal as the output audio signal; and
adjusting the limiting gain according to estimated excursion of the speaker.

23. The audio amplifying method as claimed in claim 22, wherein the speaker comprises at least one diaphragm, which has a highest response over a resonance frequency, and the step of operate the multiband dynamic range control on the pre-amplified audio signal comprises:
operating a first dynamic range control operation over a first frequency band of the pre-amplified audio signal, wherein the first frequency band is below the resonant frequency;
operating a second dynamic range control operation over a second frequency band of the pre-amplified audio signal, wherein the second band is higher than the resonant frequency;
wherein the compression ratio of the first dynamic range control operation is higher than the compression ratio of the second dynamic range control operation.

24. The audio amplifying method as claimed in claim 22, wherein the step of operate the multiband dynamic range control on the pre-amplified audio signal further comprises:
buffering the pre-amplified audio signal;
filtering the buffered pre-amplified audio signal over at least two frequency bands to obtain at least two filtered audio signals each corresponding to one of the at least two frequency band;
operating separate dynamic range control over the at least two filtered audio signal to obtain at least two compressed filtered audio signals; and
summing the at least two compressed filtered audio signals to obtain the compressed audio signals.

25. The audio amplifying method as claimed in claim 21, wherein the step of detecting over the driving circuit to obtain the at least one excursion parameter to determine the estimated excursion of the speaker in response to the driving voltage comprises:
feedback a driving current on the driving circuit in response to the driving voltage applied on the speaker to generate a first excursion parameter
feedback the output audio signal to generate a second excursion parameter; and
determining the estimated excursion of the speaker in response to the driving voltage based on the first excursion parameter and the second excursion parameter.

26. The audio amplifying method as claimed in claim 25, wherein the step of determining the estimated excursion of the speaker in response to the driving voltage based on the first excursion parameter and the second excursion parameter comprises:
calculating an impedance of the speaker by the first and second excursion parameters; and
determining the estimated excursion of the speaker according to the impedance.

27. The audio amplifying method as claimed in claim 25, wherein the input audio signal, the pre-amplified audio signal, and the output audio signal are digital signals, and further comprising:
converting the output audio signal to an analog output signal;
providing a bias voltage for amplifying the analog output audio signal under the bias voltage to obtain the driving voltage;
detecting a signal level of the first input audio signal over a time span; and adjusting a level of the bias voltage based on the signal level of the first input audio signal.

28. The audio amplifying method as claimed in claim 21, further comprising:
delaying the input audio signal to obtain a first input audio signal for looking ahead;
determining, based on the first input audio signal, an estimated excursion distortion of the speaker in response to the first input audio signal; and
determining whether the first estimated excursion entering a non-linear region of a force factor or stiffness for the speaker; and compensating the first input audio signal to generate a second input audio signal when the estimated excursion enters the non-linear region; and pre-amplifying the second input audio signal with the amplify gain to obtain a pre-amplified audio signal.

* * * * *